United States Patent
Yamamoto

(10) Patent No.: US 8,245,861 B2
(45) Date of Patent: Aug. 21, 2012

(54) CONTAINER BOX, ELECTRIC CONNECTION BOX PROVIDED WITH CONTAINER BOX

(75) Inventor: Masaki Yamamoto, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 851 days.

(21) Appl. No.: 12/246,839

(22) Filed: Oct. 7, 2008

(65) Prior Publication Data

US 2009/0096132 A1  Apr. 16, 2009

(30) Foreign Application Priority Data

Oct. 16, 2007  (JP) .................................. 2007-268959

(51) Int. Cl.
*H02G 3/08* (2006.01)

(52) U.S. Cl. ...... 220/3.7; 220/3.2; 220/4.02; 220/23.89; 220/652; 174/559; 264/297.7

(58) Field of Classification Search .................. 174/559; 220/3.2, 3.7; 264/23.89, 297.7
See application file for complete search history.

(56) References Cited

U.S. PATENT DOCUMENTS

| 6,007,371 | A | 12/1999 | Hickox |
| 6,305,656 | B1 * | 10/2001 | Wemyss ..................... 248/309.4 |
| 6,492,590 | B1 * | 12/2002 | Cheng ............................. 174/50 |
| 7,252,525 | B2 | 8/2007 | Ide et al. |

FOREIGN PATENT DOCUMENTS

| EP | 0959530 | A2 | 11/1999 |
| EP | 1715549 | A1 | 10/2006 |
| JP | 2001-044654 | A | 2/2001 |
| JP | 2003304619 | A | 10/2003 |
| JP | 2006180598 | A | 7/2006 |

OTHER PUBLICATIONS

Extended European Search Report for Application No. 08017821.3-1242, dated Feb. 26, 2010.

Japanese Office Action dated May 22, 2012 issued by the Japanese Patent Office in corresponding Japanese Application No. 2007-268959.

* cited by examiner

*Primary Examiner* — Anthony Stashick
*Assistant Examiner* — Elizabeth Volz
(74) *Attorney, Agent, or Firm* — Sughrue Mion, PLLC

(57) ABSTRACT

A container box includes an outer box for receiving an inner box therein. Ribs are formed on an inner surface of the outer box, and extend in a fitting direction, and are gradually changing in height so that molds can be easily removed after the molding. The ribs includes the normally-inclined ribs gradually increasing in height in the fitting direction of the inner box, and the reversely-inclined ribs gradually decreasing in height in the fitting direction of the inner box.

2 Claims, 7 Drawing Sheets

CONTAINER BOX, ELECTRIC CONNECTION BOX PROVIDED WITH CONTAINER BOX

BACKGROUND OF THE INVENTION

1. Field of the Invention

This invention relates to a container box, an electric connection box provided with this container box and a method of molding this container box.

2. Related Art

There is known a conventional electric connection box of the type comprising a case body of a generally rectangular box-shape for receiving, for example, a plurality of fuses, and a cover attached to the case body (see, for example, JP-A-2001-44654).

In such an electric connection box, retaining claws for preventing the disengagement of the cover are formed at an open end of the case body to which the cover body is attached, and these retaining claws are formed respectively at distal ends of elastic piece portions, and the cover is held in position by the resiliency of the elastic piece portions, and therefore is prevented from shaking.

In the case where an electronic unit such as a BCM (body control module (also called an ECU)) is fitted (inserted) into the case body through the open end thereof, ribs extending in a fitting direction of the electronic unit are usually formed on an inner surface of the case body or an outer surface of the electronic unit so as to prevent the shaking of the electronic unit, since the electronic unit is liable to be adversely affected by vibrations.

However, in the case where the ribs extending in the fitting direction are formed on this kind of case body by the use of molds, it is necessary to gradually change the height of the ribs because of limitations on the molding operation effected by the molds. Namely, in the conventional mold device, the height of each rib is smaller at the inlet side (the open end side) of the case body, and is larger at the inner end side (the bottom side) of the case body so that the mold can be easily removed from the open end of the case body. When the ribs are thus gradually changing in height in one direction, it is feared that a sufficient pressing force can not be obtained in the vicinity of the end portion where the height of the ribs are small, or an unnecessary clearance may be formed, so that the shaking cannot be eliminated, thus leaving room for improvement.

SUMMARY OF THE INVENTION

This invention has been made in view of the above problems, and an object of the invention is to provide a container box which can positively prevent the shaking, an electric connection box provided with this container box, and a method of molding the container box.

The object of the present invention has been achieved by the following constructions.

(1) A container box comprising a tubular outer box having an opening formed in at least one of upper and lower end faces thereof, wherein a plurality of ribs are formed on an inner surface of the outer box, and extend in a fitting direction of an inner box into the outer box through the opening; characterized in that:

the plurality of ribs include:

normally-inclined ribs gradually increasing in height in the fitting direction of the inner box; and reversely-inclined ribs gradually decreasing in height in the fitting direction of the inner box.

(2) An electric connection box comprising a container box as defined above.

(3) A method of molding a container box comprising an outer box having an opening formed in at least one of upper and lower end faces thereof, a plurality of ribs being formed on an inner surface of the outer box, and extending in a fitting direction of an inner box into the outer box through the opening, wherein the container box is molded using a first mold and a second mold which can be inserted and withdrawn relative to each other in an insertion/withdrawal direction parallel to the fitting direction of the inner box; characterized in that:

first recesses are formed in a surface of the first mold for forming the inner surface of the outer box, and extend in the insertion/withdrawal direction, and the normally-inclined ribs gradually increasing in height in the fitting direction of the inner box are formed using the first recesses and the second mold opposed to the first mold and movable relative to the first mold in the insertion/withdrawal direction; and insert dies are inserted in the direction of withdrawing of the first mold from the second mold, and are withdrawn in the direction of insertion of the first mold into the second mold, and second recesses are formed in the insert dies, and extend in the insertion/withdrawal direction, and the reversely-inclined ribs gradually decreasing in height in the fitting direction of the inner box are formed using the second recesses.

(4) A molding method of the invention is further characterized in that the insert dies are inserted into respective gaps formed between the first and second molds and extending in the insertion/withdrawal direction, so as to form retaining claws at an edge portion of the opening of the outer box, and the retaining claws serve to prevent the inner box from being disengaged from the outer box.

In the construction of the above Paragraph (1), the ribs having respective inclined edges are formed on the inner surface of the outer box, and extend in the fitting direction, and in order that the molds can be easily removed after the molding, these ribs include the normally-inclined ribs gradually increasing in height in the fitting direction of the inner box, and the reversely-inclined ribs gradually decreasing in height in the fitting direction of the inner box. Therefore, a sufficient pressing force against the inner box can be obtained, and any unnecessary clearance is not formed, and the shaking of the inner box can be positively prevented.

In the construction of the above Paragraph (2), the container box 10 of the construction of the above Paragraph (1) is employed in the electrical connection box which is liable to be adversely affected by vibrations, and therefore the reliability and durability of the electrical connection box can be enhanced.

In the construction of the above Paragraph (3), the normally-inclined ribs are formed using the first recesses formed in the surface of the mold for forming the inner surface of the outer box and extending in the insertion/withdrawal direction, and also the reversely-inclined ribs are formed using the second recesses formed in the insert dies (which are withdrawn from the molds in the direction of insertion of the first mold into the second mold) and extending in the insertion/withdrawal direction. Therefore, the normally-inclined ribs and the reversely-inclined ribs can be formed with a reduced number of steps, and the outer box can be formed efficiently, and the efficiency of the production can be enhanced.

In the construction of the above Paragraph (4), the insert dies are used also to form the retaining claws, and therefore the step of forming the retaining claws and the step of forming the normally-inclined ribs and the reversely-inclined ribs can be combined into one step, and besides the structure of the mold device can be simplified. Therefore, the outer box can be formed more efficiently, and the efficiency of the production can be more enhanced.

In the present invention, there can be provided the container box which can positively prevent the shaking, the electric connection box with this container box, and the method of molding this container box.

DETAILED DESCRIPTION OF THE PREFERRED EMBODIMENTS

A preferred embodiment of the present invention will now be described with reference to the drawings.

Figure 1:
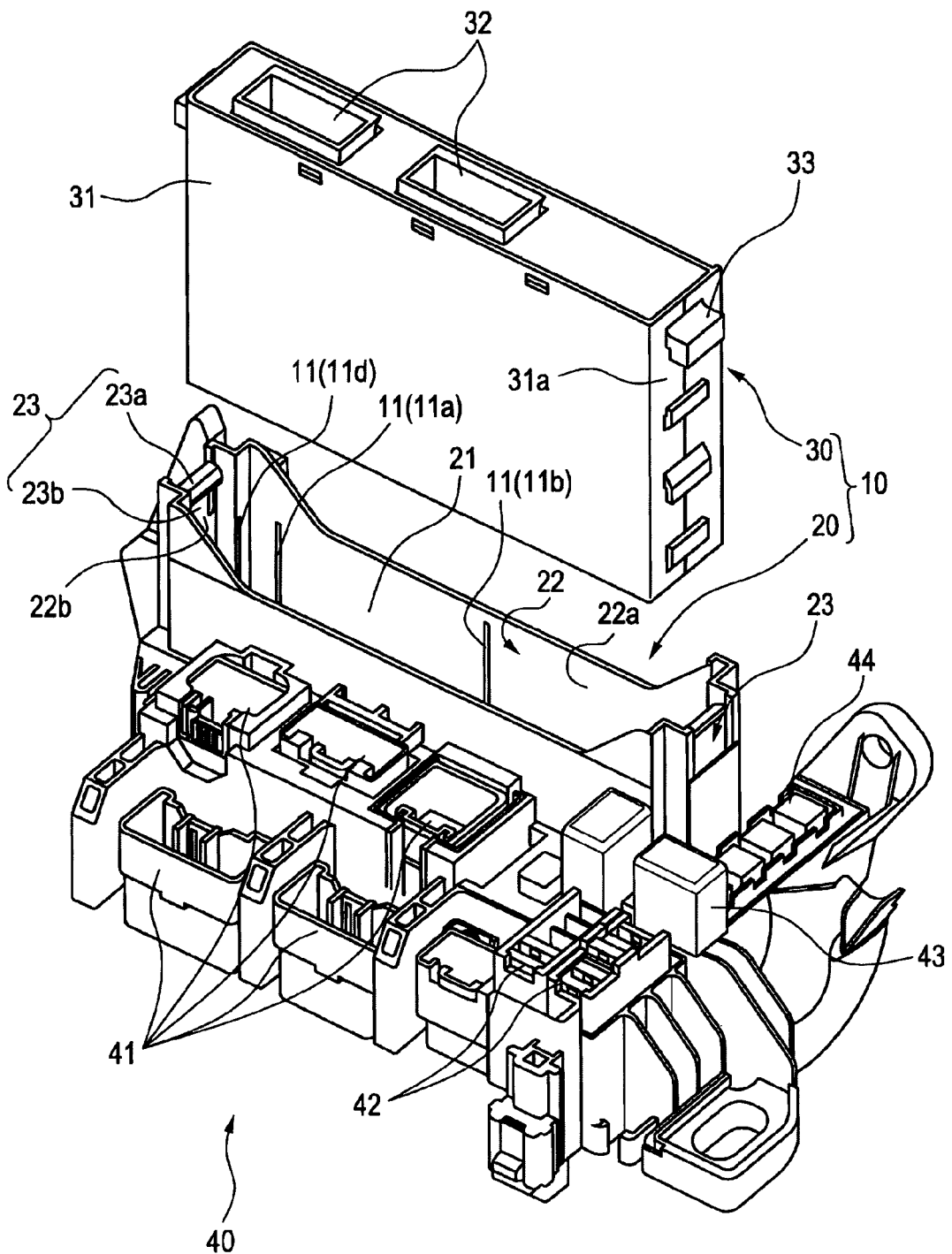
FIG. 1 is a perspective view showing a preferred embodiment of a container box of the present invention and an electric connection box provided with this container box.
Figure 2A:
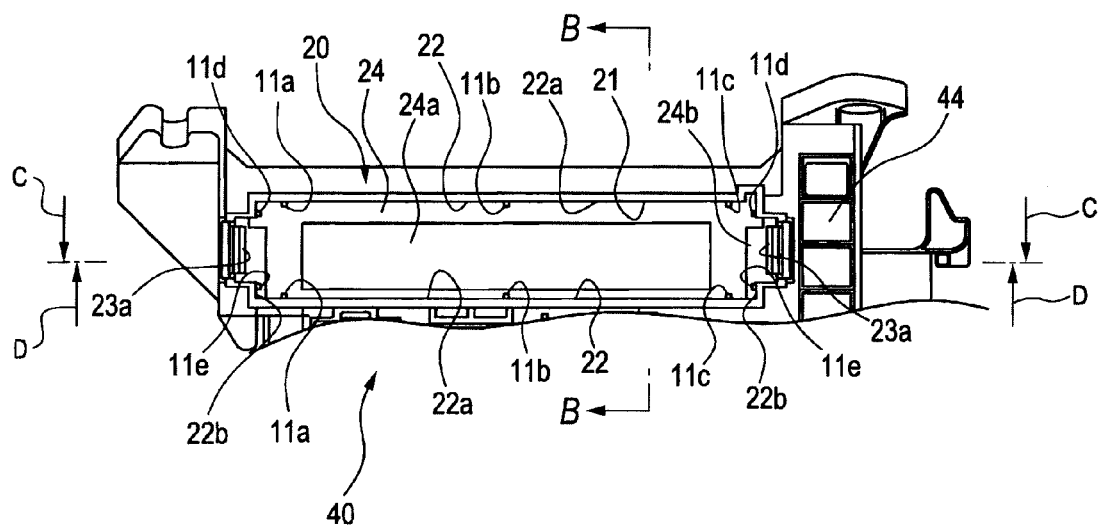
FIG. 2A is a plan view of an outer box.
Figure 2B:
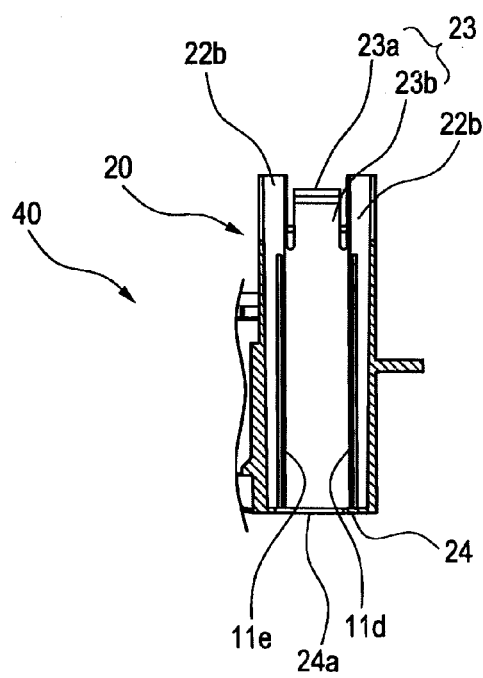
FIG. 2B is a cross-sectional view taken along the line B-B of FIG. 2A.
Figure 2C:
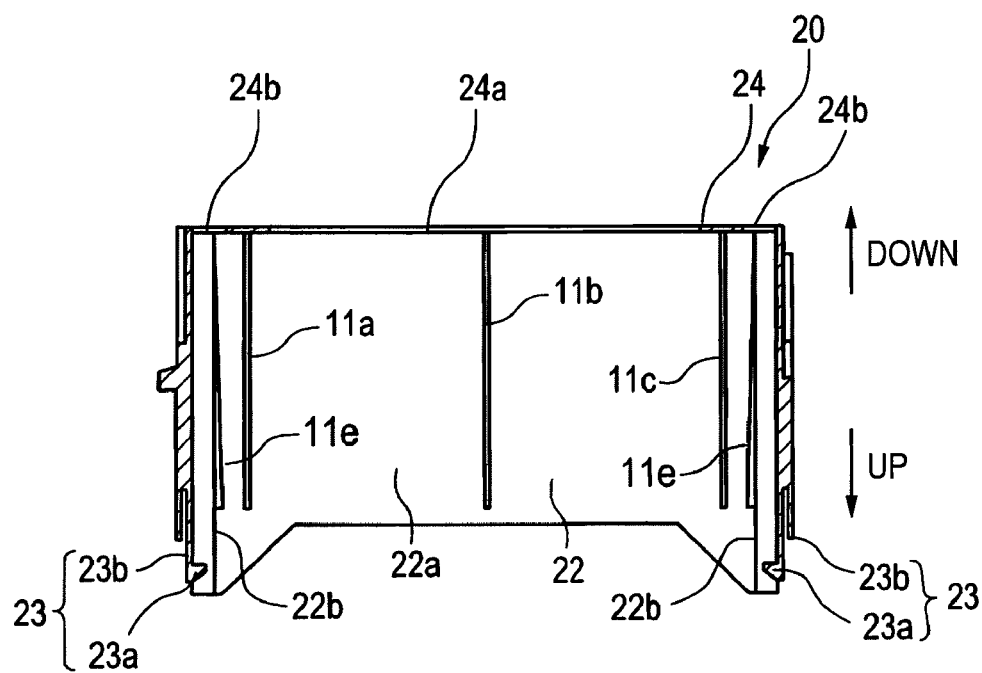
FIG. 2C is a cross-sectional view taken along the line C-C of FIG. 2A.
Figure 2D:
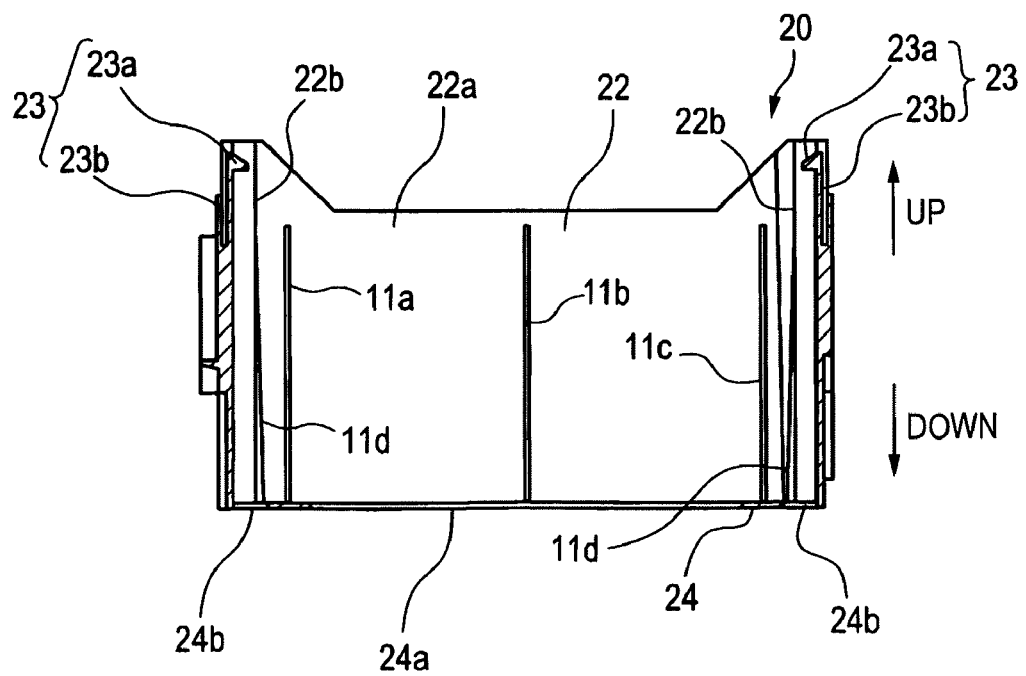
FIG. 2D is a cross-sectional view taken along the line D-D of FIG. 2A.
Figure 3A:
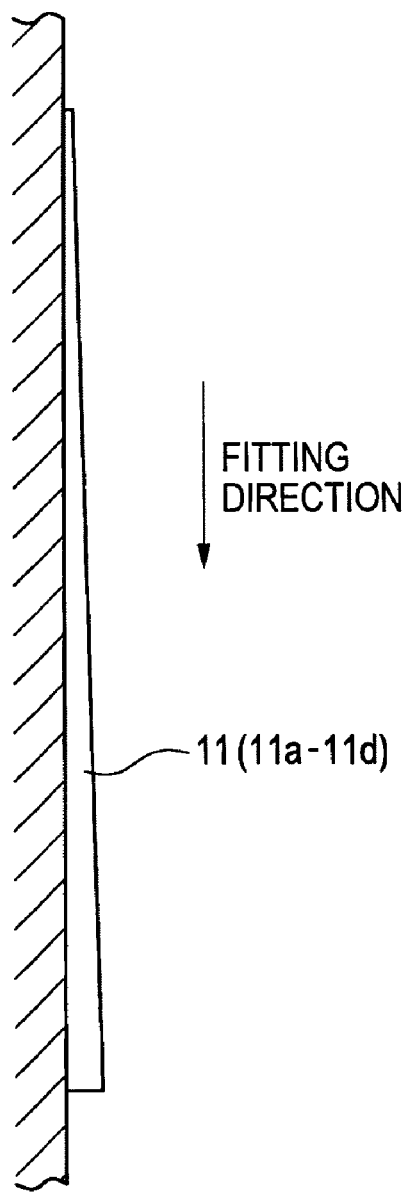
FIG. 3A is a side-elevational view of a rib gradually increasing in height in a fitting direction.
Figure 3B:
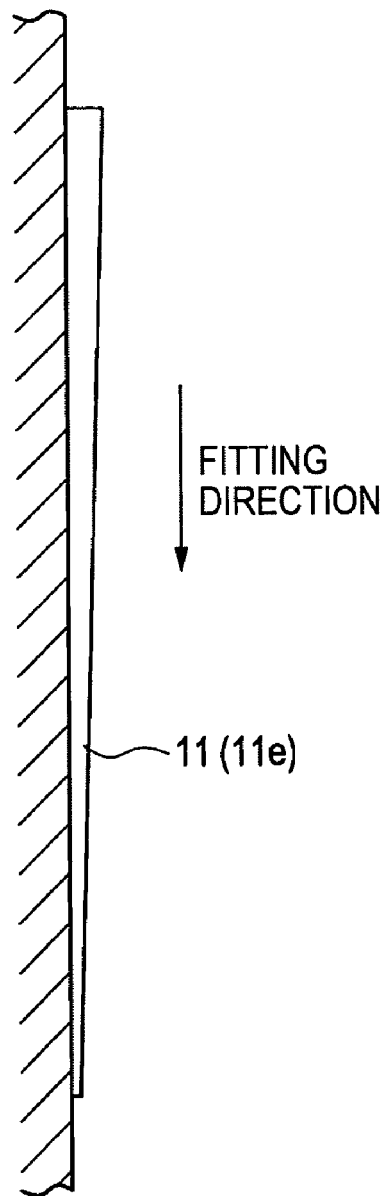
FIG. 3B is a side-elevational view of a rib gradually decreasing in height in the fitting direction.
Figure 4:
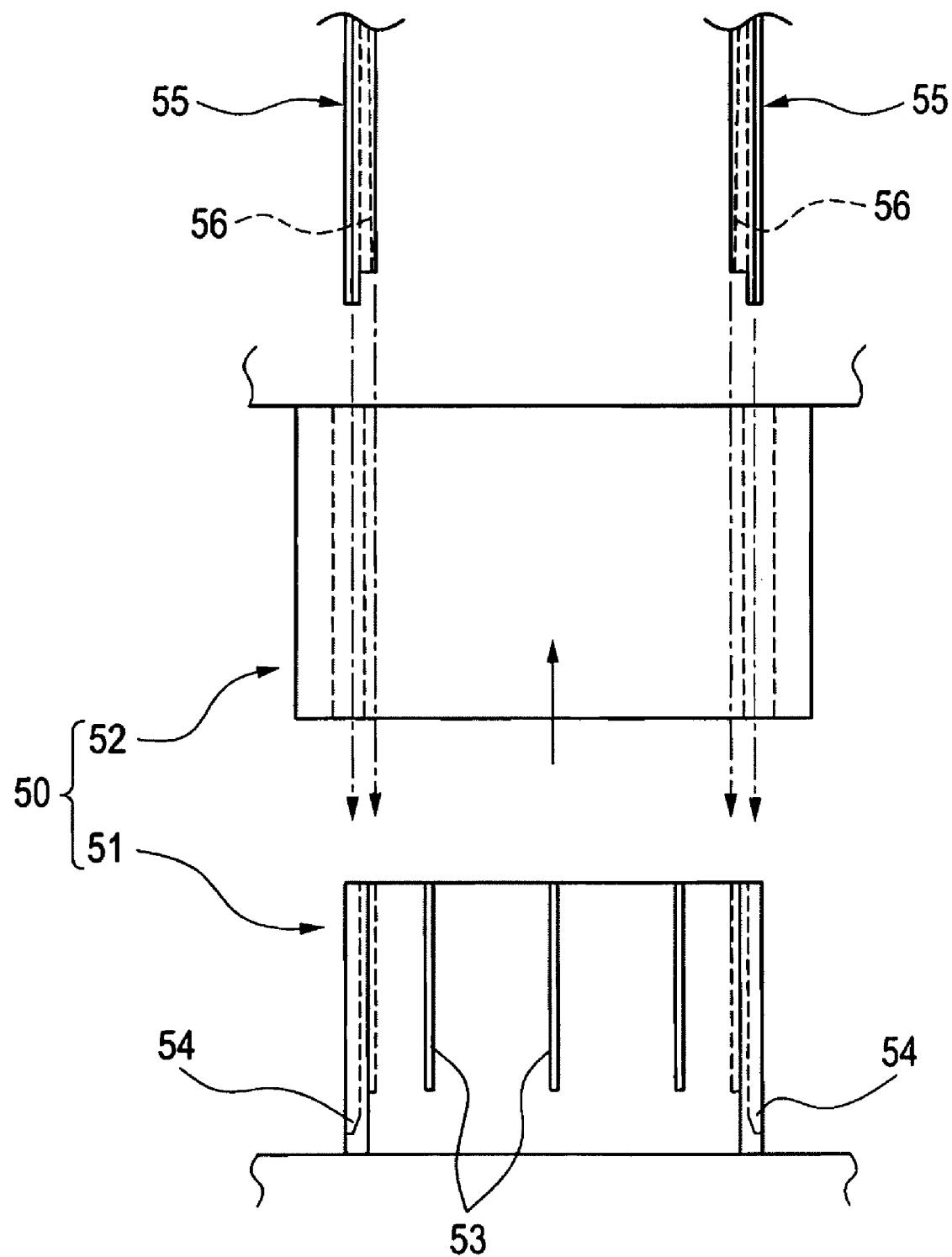
FIG. 4 is a schematic front-elevational view showing molds for molding the container body of the invention.
Figure 5:
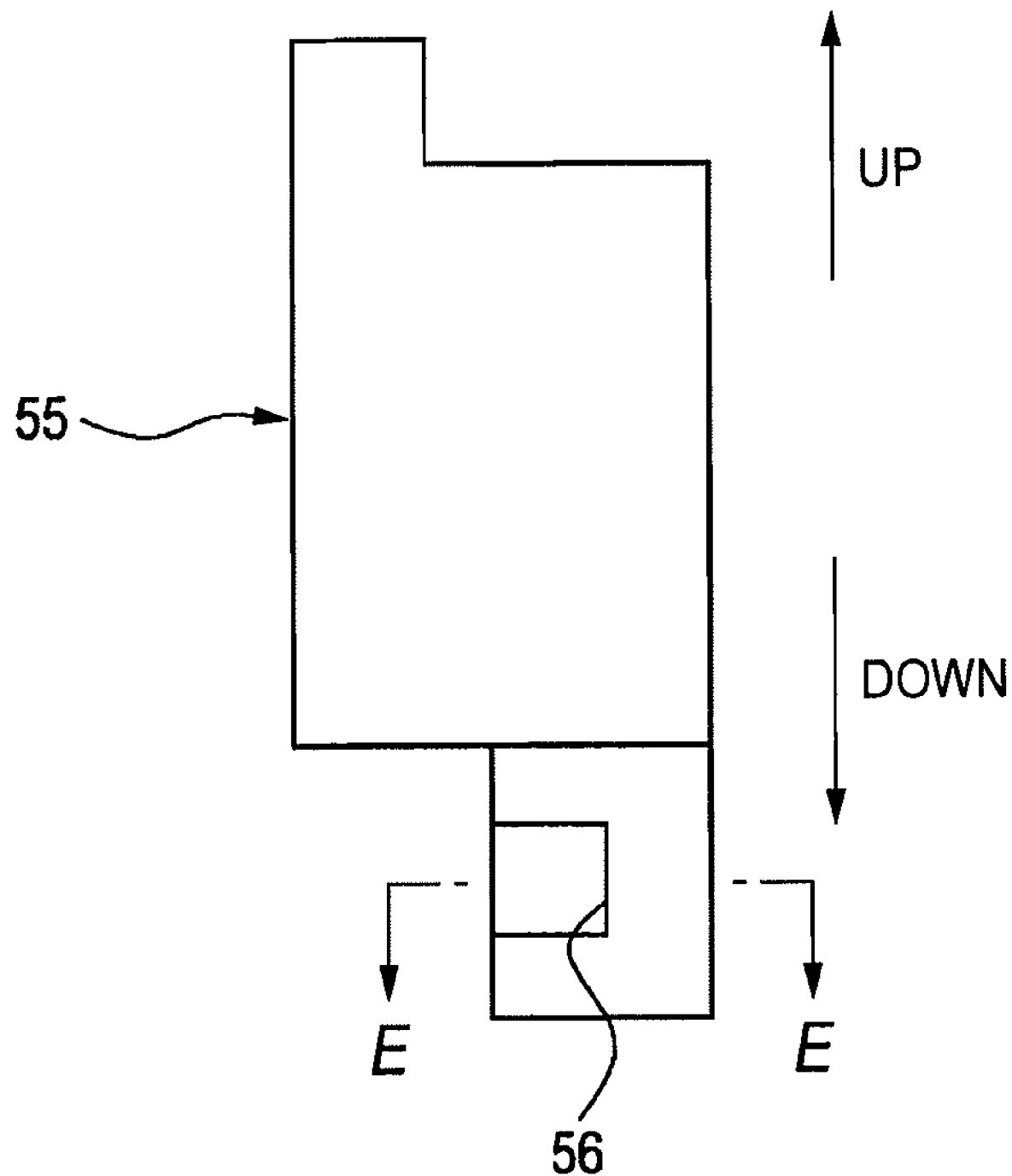
FIG. 5 is a lateral front-elevational view of an insert die for forming a retaining claw.
Figure 6:
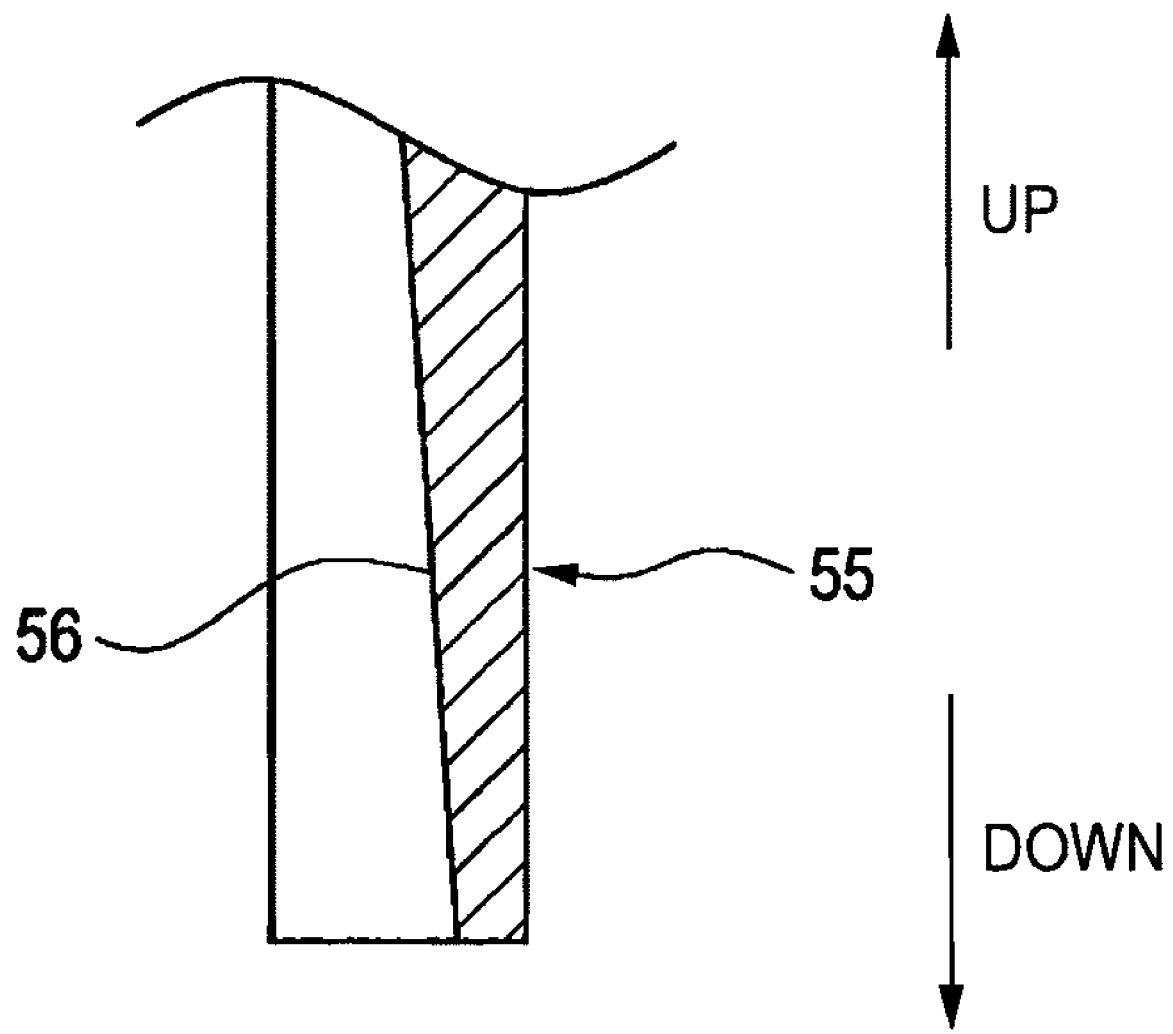
FIG. 6 is a cross-sectional view taken along the line E-E of FIG. 5.

FIG. 1 is a perspective view showing a preferred embodiment of a container box of the invention and an electric connection box provided with this container box, FIG. 2A is a plan view of an outer box, FIG. 2B is a cross-sectional view taken along the line B-B of FIG. 2A, FIG. 2C is a cross-sectional view taken along the line C-C of FIG. 2A, and FIG. 2D is a cross-sectional view taken along the line D-D of FIG. 2A. FIG. 3A is a side-elevational view of a rib gradually increasing in height in a fitting (inserting) direction, FIG. 3B is a side-elevational view of a rib gradually decreasing in height in the fitting direction, FIG. 4 is a schematic front-elevational view showing molds for molding the container body of the invention, FIG. 5 is a lateral front-elevational view of an insert die for forming a retaining claw, and FIG. 6 is a cross-sectional view taken along the line E-E of FIG. 5.

As shown in FIG. 1, the electric connection box 40 of this embodiment comprises the container box 10, and is installed, for example, on a wall disposed adjacent to a lower end of a driver's seat within a compartment of an automobile, and controls electrical functions of the automobile.

As shown in FIG. 1, the electric connection box 40 includes connectors 41, fuses 42, relays 43, fusible links 44, etc., provided at the outer periphery of the outer box 20 of the container box 10 described later. Cavity portions for receiving the connectors 41, the fuses 42, the relays 43, the fusible links 44, etc., and the outer box 20 are molded integrally with each other, using a resin.

An electronic unit, such as a BCM (body control module (also called an ECU)), is used as an inner box 30 of the container, box 10 described later.

Therefore, when the inner box (BCM) 30 is inserted into the outer box 20, electric power can be supplied in a stable manner from a battery to various portions, and also signals can be fed to various portions in a stable manner.

Next, the container box 10 will be described in detail.

As shown in FIGS. 1 and 2A, the container box 10 comprises the hollow outer box 20 having an opening 21 formed in one of upper and lower end faces (here, the upper face is open), and the inner box 30 which can be fitted (inserted) into the outer box 20 through the opening 21. A plurality of ribs 11 are formed on an inner surface (inner peripheral surface) 22 of the outer box 20, and extend in a fitting direction of the inner box 30.

The inner box 30 is in the form of a rectangular box made of a resin, and this inner box 30 is so sized as to be fitted into the outer box 20. Connectors 32 for connection to power lines and signal lines are formed in an upper face of the inner box 30. Retaining projections 33 are formed respectively at upper end portions of shorter faces 31a of the inner box 30, and when the inner box 30 is fitted into the outer box 20, these retaining projections 33 are retained respectively by retaining portions 23 of the outer box 20, thereby preventing the inner box 30 from being disengaged from the outer box 20.

As shown in FIGS. 2A, 2B, 2C and 2D, the outer box 20 has a rectangular box-shape, and has the opening 21 (serving as an insertion port for the inner box 30) formed at its upper end. The outer box 20 includes a pair of opposed longer surfaces 22a and 22a having a larger width, and a pair of opposed shorter surfaces 22b and 22b (extending substantially perpendicular to the direction of extending of the longer surfaces 22a and 22a) having a smaller width. The retaining portions 23 (which retain the respective retaining projections 33 of the inner box 30 to prevent the disengagement of the inner box 30) are formed respectively at upper end portions (an edge portion of the opening 21) of the opposed shorter surfaces 22b.

Each retaining portion 23 has the retaining claw 23a (for retaining engagement with the retaining projection 33 of the inner box 30) formed at its distal end, and this retaining claw 23a is supported by an elastic portion 23b so as to be outwardly displaced. Therefore, when the inner box 30 is fitted into the outer box 20, the retaining projections 33 of the inner box 30 are brought into abutting engagement with the distal ends of the respective retaining claws 23a, and the elastic portions 23b are elastically deformed outwardly, so that the retaining claws 23a are displaced outwardly (that is, away from each other).

Then, when the inner box 30 is completely fitted into the outer box 20, the elastic portions 23b are restored, so that the retaining claws 23a are moved inwardly (that is, toward each other), and retain the retaining projections 33, respectively.

The ribs 11 are formed on the four surfaces 22a and 22b of the inner peripheral surface 22 of the outer box 20. Three ribs 11a, 11b and 11c are formed respectively at one end portion, a central portion and the other end portion of each longer surface 22a, and ribs 11d and 11e are formed respectively on opposite side portions of each shorter surface 22b, with the retaining claw 23 interposed therebetween.

The ribs, when called collectively, will be designated by reference numeral 11, and the ribs, when distinguished from one another, will be designated by reference numerals 11a, 11b, . . . , 11e.

As shown in FIGS. 2C, 2D and 3A, the ribs 11a, 11b and 11c formed on each longer surface 22a are gradually increasing in height in the fitting direction (that is, toward the lower surface of the outer box 20) (These ribs 11a, 11b and 11c will hereinafter be referred to as "normally-inclined ribs"). The rib 11d formed on each shorter surface 22b is the normally-inclined rib, and therefore is gradually increasing in height in the fitting direction, while the other rib 11e on the shorter surface 22b is gradually decreasing in height in the fitting direction (This rib 11e will hereinafter be referred to as "the reversely-inclined rib"). Namely, edges of the ribs 11e are inclined in the direction opposite to the direction of inclination of edges of the other ribs 11a to 11d.

The ribs 11 can be inclined over their entire length as shown in FIGS. 3A and 3B. However, in so far as the molds can be easily removed after the molding operation, such an inclined portion may be formed, for example, at part of each rib 11.

As shown in FIGS. 2A, 2B, 2C and 2D, a notch 24a is formed through a central portion of a bottom wall 24 of the outer box 20. A pair of notches 24b are also formed respectively through opposite end portions of the bottom wall 24 disposed immediately adjacent respectively to the lower ends of the shorter surface 22b. The notches 24b are formed for withdrawing insert dies for molding the retaining claws 23a at the upper end portions of the shorter surfaces 22b.

Next, a method of molding the container box 10 of the invention will be described.

In the method of the invention for molding the container box 10, the outer box 20 is molded by the use of a mold device 50 shown in FIG. 4, and this mold device 50 comprises a pair of male and female molds 51 and 52 which can be inserted and withdrawn relative to each other in an insertion/withdrawal direction parallel to the fitting direction of the inner box 30 into the outer box 20, and insert dies 55 and 55 which can be inserted into and withdrawn respectively from gaps 54 formed between the combined male and female molds 51 and 52 and extending in the insertion/withdrawal direction. Recesses (or grooves) 53 are formed in an outer peripheral surface of the male mold (first mold) 51 for forming the inner peripheral surface 22 of the outer box 20, and extend in the insertion/withdrawal direction. In the molding of the outer box 20, the normally-inclined ribs 11a to 11d are formed using the recesses 53 and the female mold (second mold) 52 opposed to the male mold 51 and movable relative to the male mold 51 in the insertion/withdrawal direction. Also, the insert dies 55 and 55 are inserted respectively into the gaps 54, and the retaining claws 23a are formed between the male mold 51 and the female mold 52, and the reversely-inclined ribs 11e are formed, using recesses 56 formed respectively in the insert dies 55 and 55.

Namely, each of the recesses 53 for respectively forming the normally-inclined ribs 11a to 11d (see FIG. 3A) is gradually increasing in depth from a proximal end portion (lower end portion in FIG. 4) of the male mold 51 toward a distal end portion (upper end portion in FIG. 4) thereof, and therefore after the normally-inclined ribs 11a to 11d are formed, the male mold 51 can be easily removed from the molded product (that is, the outer box 20).

On the other hand, it may be proposed to mold the reversely-inclined ribs 11e (which are to be formed respectively on the shorter surfaces 22b), using recesses similar to the recesses 53 of the male mold 51 for forming the ribs 11a to 11d. In this case, however, at the time when the male mold 51 is removed from the molded outer box 20, this removing operation is adversely affected because of the presence of the molded reversely-inclined ribs 11e. Therefore in order to form the reversely-inclined ribs 11e, it is necessary to prepare separate molds which are inserted in a direction opposite to the direction of insertion of the male mold 51.

Furthermore, in addition to the male mold 51 and the female mold 52, the insert dies 55 must be prepared for forming the retaining claws 23a in the respective gaps 54 formed between the male and female molds 51 and 52 and extending in the insertion/withdrawal direction. In the molding operation, the insert dies 55 are inserted toward the male mold 51 from a proximal end (upper end in FIG. 4) of the female mold 52, and therefore the direction of insertion of these insert dies 55 is opposite to the direction of insertion of the male mold 51.

Therefore, in the method of the invention for molding the container box 10, the recesses 56 for forming the respective ribs 11e are formed respectively in side surfaces of the insert dies 55, and extend in the insertion/withdrawal direction as shown in FIGS. 4 and 5. As shown in FIG. 6, the recess 56 is gradually increasing in depth in the direction of insertion of the insert die 55. Therefore, in this molding method, the reversely-inclined rib 11e and the retaining claw 23a can be mold by one mold. After the molding operation, the insert dies 55 are removed upwardly (FIG. 4) from the proximal end of the female mold 52, and therefore the notches 24b are formed in the bottom wall 24 of the outer box 20.

FIG. 5 shows the lateral front side of the left insert die 55 of FIG. 4.

In the container box 10 of the above embodiment, the ribs 11 having the respective inclined edges are formed on the inner peripheral surface 22 of the outer box 20, and extend in the fitting direction of the inner box 30 into the outer box 20, and in order that the molds can be easily removed after the molding, these ribs 11 include the normally-inclined ribs 11a to 11d gradually increasing in height in the fitting direction of the inner box 30, and the reversely-inclined ribs 11e gradually decreasing in height in the fitting direction of the inner box 30. Therefore, there will not be encountered a situation (as in the conventional construction in which the edges of the ribs are inclined only in one direction) in which a sufficient pressing force can not be obtained in the vicinity of the end portion where the height of the ribs are small, thus failing to completely eliminate the shaking. Namely, the sufficient pressing force against the inner box 30 can be obtained, and any unnecessary clearance is not formed, and the shaking of the inner box 30 can be positively prevented.

Furthermore, the container box 10 of the above construction (including the normally-inclined ribs 11a to 11d gradually increasing in height in the fitting direction of the inner box 30, and the reversely-inclined ribs lie gradually decreasing in height in the fitting direction of the inner box 30) is employed in the electrical connection box 40 which is liable to be adversely affected by vibrations, and therefore the reliability and durability of the electrical connection box can be enhanced.

Furthermore, in the above molding method, the normally-inclined ribs 11a to 11d are formed using the recesses 53 formed in the surface of the male mold 51 for forming the inner peripheral surface of the outer box 20 and extending in the insertion/withdrawal direction, and also the reversely-inclined ribs lie are formed using the recesses 56 formed in the insert dies 55 (which are withdrawn from the molds in the direction of insertion of the male mold 51 into the female mold 52) and extending in the insertion/withdrawal direction. Therefore, the normally-inclined ribs 11a to 11d and the reversely-inclined ribs 11e can be formed with a reduced number of steps, and the outer box 20 can be formed efficiently, and the efficiency of the production can be enhanced.

Furthermore, in the above molding method, the insert dies 55 are used also to form the retaining claws 23a, and therefore the step of forming the retaining claws 23a and the step of forming the normally-inclined ribs 11a to 11d and the reversely-inclined ribs lie can be combined into one step, and besides the structure of the mold device 50 can be simplified. Therefore, the outer box 20 can be formed more efficiently, and the efficiency of the production can be more enhanced.

The present invention is not limited to the above embodiment, and suitable modifications improvements, etc., can be made. Furthermore, the material, shape, dimensions, numerical values, form, number, disposition, etc., of each of the constituent elements of the above embodiment are arbitrary and are not limited in so far as the invention can be achieved.

For example, in the above embodiment, although the ribs 11 are formed only on the inner surface 22 of the outer box 20, reversely-inclined ribs gradually decreasing in height in the fitting direction of the inner box 30 may be formed on the outer surface 31 of the inner box 30, in which case the formation of the ribs 11e on the inner surface 22 of the outer box 20 may be omitted.

Furthermore, in the above embodiment, although the normally-inclined rib 11d and the reversely-inclined rib 11e are formed on each shorter surface 22b of the outer box 20, the normally-inclined ribs and the reversely-inclined rib can be formed on each longer surface 22a, or the normally-inclined ribs and the reversely-inclined ribs can be formed on both of each shorter surface 22b and each longer surface 22a.

Furthermore, in the above embodiment, although the invention is directed to the electric connection box 40 adapted to be installed in the compartment of the automobile, the invention can be applied to the type of electric connection box adapted to be installed at any other portion.

Furthermore, in the above embodiment, although the electric connection box 40 includes the BCM serving as the inner box 30, the invention can be applied to various connectors. For example, the structure of the outer box 20 can be applied to a female housing of such a connector, while the structure of the inner box 30 can be applied to a male housing for fitting into the female housing.

Incidentally, the inner box 30 fitted into the outer box 20 is not an essential constituent element of the container box 10, and therefore may be omitted.

What is claimed is:

1. A container box comprising:
    a tubular outer box having an opening formed in at least one of upper and lower end faces thereof, in which a plurality of ribs are formed on an inner surface of said outer box so as to extend in a fitting direction of an inner box into said outer box through said opening;
    said plurality of ribs including:
    normally-inclined ribs gradually increasing in height in the fitting direction of said inner box; and
    reversely-inclined ribs gradually decreasing in height in the fitting direction of said inner box.

2. An electric connection box comprising a container box as defined in claim 1.

* * * * *